United States Patent
Winters et al.

(10) Patent No.: US 7,019,331 B2
(45) Date of Patent: Mar. 28, 2006

(54) GREEN LIGHT-EMITTING MICROCAVITY OLED DEVICE USING A YELLOW COLOR FILTER ELEMENT

(75) Inventors: Dustin Winters, Webster, NY (US); Paula J. Alessi, Rochester, NY (US); Michael L. Boroson, Rochester, NY (US); Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 7 days.

(21) Appl. No.: 10/762,675

(22) Filed: Jan. 22, 2004

(65) Prior Publication Data

US 2005/0161665 A1    Jul. 28, 2005

(51) Int. Cl.
*H01L 27/15* (2006.01)
*H01J 1/62* (2006.01)

(52) U.S. Cl. .................... 257/79; 257/89; 257/92; 257/98; 428/690; 428/917; 313/504; 313/506

(58) Field of Classification Search ............. 257/79, 257/89, 92, 98; 428/690, 917, 212, 332; 313/504, 506
See application file for complete search history.

(56) References Cited

U.S. PATENT DOCUMENTS

| | | |
|---|---|---|
| 4,356,429 A | 10/1982 | Tang |
| 5,276,380 A | 1/1994 | Tang |
| 5,405,710 A | 4/1995 | Dodabalapur et al. |
| 5,550,066 A | 8/1996 | Tang et al. |
| 5,554,911 A | 9/1996 | Nakayama et al. |
| 5,780,174 A | 7/1998 | Tokito et al. |
| 6,281,634 B1 | 8/2001 | Yokoyama |
| 6,392,340 B1 | 5/2002 | Yoneda et al. |
| 6,456,013 B1 | 9/2002 | Komiya et al. |
| 6,873,091 B1 * | 3/2005 | Bechtel et al. .............. 313/112 |
| 6,873,093 B1 * | 3/2005 | Yu et al. .................... 313/112 |
| 2002/0186214 A1 | 12/2002 | Siwinski |
| 2002/0190639 A1 | 12/2002 | Yamada et al. |
| 2003/0011306 A1 | 1/2003 | Bechtel et al. |

FOREIGN PATENT DOCUMENTS

| | | |
|---|---|---|
| EP | 1 154 676 A1 | 11/2001 |
| WO | WO 03/039203 | 5/2003 |

* cited by examiner

*Primary Examiner*—Donghee Kang
(74) *Attorney, Agent, or Firm*—Raymond L. Owens

(57) ABSTRACT

An OLED device having green emitting regions disposed over a substrate, and wherein each green emitting region includes one or more light-emitting layer(s), a reflector and a semitransparent reflector respectively disposed on opposite sides of the light-emitting layer(s) and arranged to resonate light produced by such layers such that the light has a substantial green spectral component, and a yellow color filter element disposed in relationship to each green emitting region to produce green light.

9 Claims, 6 Drawing Sheets

GREEN LIGHT-EMITTING MICROCAVITY OLED DEVICE USING A YELLOW COLOR FILTER ELEMENT

FIELD OF INVENTION

This invention relates to microcavity organic electroluminescent (EL) devices.

BACKGROUND OF THE INVENTION

Full color organic electroluminescent (EL), also known as organic light-emitting devices or OLED, have recently been demonstrated as a new type of flat panel display. In simplest form, an organic EL device is comprised of an electrode serving as the anode for hole injection, an electrode serving as the cathode for electron injection, and an organic EL medium sandwiched between these electrodes to support charge recombination that yields emission of light. An example of an organic EL device is described in commonly assigned U.S. Pat. No. 4,356,429. In order to construct a pixilated display device such as is useful, for example, as a television, computer monitor, cell phone display or digital camera display, individual organic EL elements can be arranged as an array of pixels in a matrix pattern. To produce a multicolor display, the pixels are further arranged into subpixels, with each subpixel emitting a different color. This matrix of pixels can be electrically driven using either a simple passive matrix or an active matrix driving scheme. In a passive matrix, the organic EL layers are sandwiched between two sets of orthogonal electrodes arranged in rows and columns. An example of a passive matrix driven organic EL devices is disclosed in U.S. Pat. No. 5,276,380. In an active matrix configuration, each pixel is driven by multiple circuit elements such as transistors, capacitors, and signal lines. Examples of such active matrix organic EL devices are provided in U.S. Pat. Nos. 5,550,066, 6,281,634, and 6,456,013.

OLED displays can be made to have one or more colors. Full color OLED devices are also known in the art. Typical full color OLED devices are constructed of pixels having three subpixels that are red, green, and blue in color. Such an arrangement is known as an RGB design. An example of an RGB design is disclosed in U.S. Pat. No. 6,281,634. Full color organic electroluminescent (EL) devices have also recently been described that are constructed of pixels having four subpixels that are red, green, blue, and white in color. Such an arrangement is known as an RGBW design. An example of an RGBW device is disclosed in U.S. Patent Application Publication 2002/0186214 A1.

Several approaches to obtaining color displays are known in the art. For example, each differently colored subpixel can be constructed using one or more different OLED materials. These materials are selectively placed on the subpixels with methods including shadow masks, thermal transfer from a donor sheet, or ink jet printing. Another approach to producing a color display is to place OLED materials in a common stack of one or more layers across all the differently colored subpixels and then use one or more different color filters to selectively convert the common OLED color to different colors for each subpixel. In this case the OLED materials are typically arranged so as to produce a broad emission spectrum, also referred to as white emission or white OLED. An example of a white OLED with color filters is disclosed in U.S. Pat. No. 6,392,340.

Yet another approach to achieving a color display is to place the OLED emission element within a microcavity structure to enhance emission at a specific wavelength as determined by the optical cavity length of the microcavity. Examples of such microcavity devices are shown in U.S. Pat. Nos. 5,405,710 and 5,554,911. In this case, broad emitting OLED materials can be used and, by varying the optical length of the cavity for each differently colored subpixel, different colored emission can be achieved. However, devices constructed with microcavities suffer from the problem that when viewed at various angles, the color of the emission can change. This effect is described in U.S. Pat. No. 5,780,174. Therefore, an OLED device using microcavity structures having reduced dependence of perceived color on the angle of view is desired.

SUMMARY OF THE INVENTION

It is therefore an object of the present invention to provide an OLED device having a microcavity structure capable of producing green light which, when viewed at various angles relative to the substrate, has reduced variation in perceived color. This object is achieved by providing an OLED device having green emitting regions disposed on a substrate, and wherein each green emitting region includes a) one or more light-emitting layer(s), b) a reflector and a semitransparent reflector respectively disposed on opposite sides of the light-emitting layer(s) and arranged to resonate light produced by such layers such that the light has a substantial green spectral component, and c) a yellow color filter element disposed in relationship to each green emitting region to produce green light.

ADVANTAGES

The invention has the advantage over conventional microcavity devices that the apparent change in color when viewed at various angles relative to the substrate is reduced. The invention has the further advantage that the loss of luminance in the principle green light emission as viewed at an angle normal to the substrate due to absorption in the color filter element is minimal.

DETAILED DESCRIPTION OF THE INVENTION

OLED microcavity devices are constructed by placing the electroluminescent organic medium between a reflector and semitransparent reflector. The optical thickness of the layers between reflector and the semitransparent reflector are then optimized to form a cavity which resonates light of a particular wavelength. OLED microcavity devices can be constructed with a Quarter Wave Stack (QWS) serving the function of the semitransparent reflector. An example of an OLED microcavity device with a QWS is shown in U.S. Pat. No. 5,405,710. OLED microcavity devices can also be formed using a thin metallic layer to form the semitransparent reflector. An example of an OLED microcavity device with a thin metallic layer as the semitransparent reflector is discussed in N. Takada, T. Tsutsui, S. Saito; Appl. Phy. Lett, 63 (15), 2032–2034, 1993. Microcavity devices tend to have narrow and intense spectral emission when viewed at the normal (0 degree) viewing angle. This effect can be used to produce full color devices from a single broad spectrum emitting OLED medium such as shown in U.S. Pat. No. 5,554,911. However, as the viewing angle from the normal is increased, the spectral emission tends to shift toward lower wavelengths as illustrated in U.S. Pat. No. 5,780,174. For a green tuned microcavity, it is meant the perceived color would shift from green to blue at high angles. By incorporating a color filter element which absorbs light at lower wavelengths, the apparent change in color can be suppressed.

Figure 1:
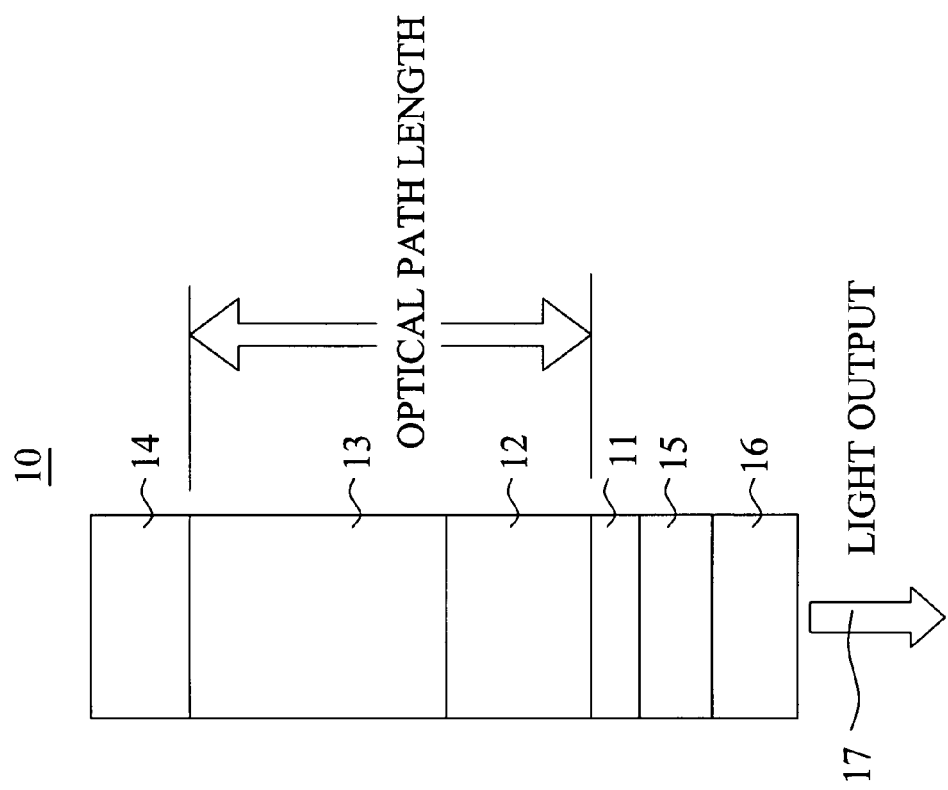
FIG. 1 depicts a cross-sectional view of a microcavity device according to the present invention.

FIG. 1 is an enlarged cross section of a simplified OLED microcavity device 10 according to the present invention. The OLED microcavity device 10 is constructed of a semitransparent reflector 11, a cavity spacer 12, an organic EL medium 13, a reflector 14, a substrate 16, and a color filter element 15. In such a microcavity device, light is generated in the organic EL medium and resonates between the reflector 14 and the semitransparent reflector 11 and exits the device through the semitransparent reflector 11 toward the viewer. In this case, the semitransparent reflector 11 could be constructed of a thin metal layer such as Ag or an alloy of Ag, which is preferably between 5 nm and 35 nm in thickness. The cavity spacer 12 is constructed of a transparent material such as ITO. In this example the cavity spacer layer also serves as the first electrode for the OLED device. While the cavity spacer layer is shown as a single layer, it can alternately be composed of several layers. The reflector 14 is preferably constructed of a highly reflective metal including but not limited to Al, Ag, Au, and alloys thereof. In this example, the reflector also serves as the second electrode for the OLED device.

The organic EL medium 13 is located between the first and second electrodes, in this case the cavity spacer 12 and the reflector 14 and can be chosen from many organic materials, known in the art. The organic EL medium 13 is typically constructed of several sublayers such as a hole injection layer, a hole transporting layer, a light-emitting layer, and an electron transporting layer. The organic EL medium can be constructed of small molecule organic materials, which are typically deposited by evaporation methods or by thermal transfer from a donor substrate. Alternately, the organic EL medium can be constructed of polymer materials, commonly referred to as PLED's, which can be deposited by methods such as ink jet printing or solvent spin or dip coating. The organic EL medium can be arranged to generate a narrow bandwidth emission or a broad or white emission spectrum. Many possible configurations and materials can be chosen for the organic EL medium by one skilled in the art.

The substrate 16 is shown in FIG. 1 as being between the viewer and the organic EL medium 13, that is the semitransparent reflector 11 is between the organic EL medium 13 and the viewer. This configuration where light travels through the substrate is known as a bottom emission device. In this configuration, a transparent substrate such as glass or plastic is used. Alternately, the device could be fabricated with the reflector between the substrate and the organic EL medium. This alternate configuration is known as a top emission device. In a top emission device, light does not pass through the substrate and the substrate can therefore be optionally opaque. This enables the use of a large variety of substrates. One example substrate that can be used with a top emission configuration is a silicon wafer. The substrate can further include active matrix circuitry (not shown) to drive the microcavity device.

Optical path length is defined as refractive index (n) multiplied by the thickness (d) for each layer. In a microcavity device such as microcavity device 10, the total optical path length ($n_i d_i$) of the layers between the reflector and the semitransparent reflector is designed so as to approximately satisfy the following equation:

$$2\Sigma(n_i d_i)/\lambda_1 + (Q_1 + Q_2)/2\pi = m \quad \text{(Equation 1)}$$

wherein:

$n_i$ is the index of refraction and $d_i$ is the thickness of the ith layer;

$Q_1$ and $Q_2$ are the phase shifts in radians at the reflector 14 interface and the semitransparent reflector 11, respectively;

$\lambda_1$ is the predetermined primary wavelength to be emitted from the device; and m is a non-negative integer.

The product of index of refraction and the thickness of the layers is defined as the optical thickness. For a green microcavity device according to the present invention, this primary wavelength $\lambda_1$ is preferably between 490 nm and 570 nm, and more preferably between 500 nm and 550 nm.

Microcavity device 10 is an example microcavity device structure. Several variations are known in the art and can also be applied to the present invention. For example, the semitransparent reflector could be constructed from a quarter wave stack of several alternating layers of transparent materials having different refractive indexes. The cavity spacer layer could alternately be placed between the reflector and the organic EL medium, or it could be eliminated entirely. In either of these cases, the semitransparent reflector would then need to serve as an electrode for the organic EL medium.

The color filter element 15 is disposed outside of the microcavity structure on the side of the semitransparent reflector 11 so as to be between the semitransparent reflector and the viewer. In a multicolored pixilated display, it is preferable to locate the color filter element as close to the microcavity structure as possible to minimize pixel crosstalk. In a bottom emission device, the color filter element is therefore preferably located between the microcavity and substrate. However, the invention can also be made to work by placing the color filter element on the outside of the substrate. In a top emission device, the color filter element is preferably located above the microcavity structure. However, the invention can also be made to work by locating the color filter element on either side of an attached second cover substrate (not shown). The color filter element 15 is arranged so as to yield filtered light emission 17.

An OLED device made in accordance with the present invention has green emitting regions which produce light having a substantial green component. By using a yellow color filter element, light which passes through such a filter element will be perceived by the observer to be green. A yellow filter is a high pass filter which will be substantially transmissive to green and red light and non-transmissive to blue light.

Preferably, the color filter element is selected so as to have a high transmittance at approximately the desired green wavelength enhanced by the microcavity layer and higher visible wavelengths, while having low transmittance at lower visible wavelengths. The preferred color filter element has a maximum visible transmittance and a minimum visible transmittance and a cut-off wavelength $\lambda_2$ and where at visible wavelengths lower than the cut-off wavelength $\lambda_2$ transmittance is lower than the transmittance at the cut-off wavelength $\lambda_2$ and at visible wavelengths higher than the cut-off wavelength $\lambda_2$, transmittance is higher than the transmittance at the cut-off wavelength $\lambda_2$. Cut-off wavelength $\lambda_2$ is defined here as the wavelength where the transmittance is midpoint between the maximum visible transmittance and the minimum visible transmittance. The cut-off wavelength is preferably between 475 nm and 560 nm, and more preferably between 490 nm and 540 nm. While the visible wavelengths are defined as all wavelengths detectable by the human eye, a narrower range of 400 nm to 700 nm is sufficient to make practical use of the invention as most OLED emission tends to fall within this range.

Color filter technology has been applied to OLED devices in the prior art. An example of a non-microcavity white OLED device with color filter elements is shown in U.S. Pat. No. 6,392,340. In this example, however, a green filter is used. Green color filters are band-pass type filters transmitting in a band of wavelengths in the green region while absorbing lower blue wavelengths and higher red wavelengths. These green filters, which are band-pass type filters, tend to have lower transmittance in the green wavelengths than a comparable high pass, or yellow, filter. However, in the device shown in U.S. Pat. No. 6,392,340, a band-pass green filter is necessary to achieve a green colored subpixel and complete a full color RGB device. In this case, a high pass, or yellow, filter would result in yellow emission, which would not produce a satisfactory color gamut for a full color device. In contrast, for a microcavity device, which already emits green light at the normal viewing angle and has an optical cavity that is tuned to enhance green emission, adding a yellow color filter still results in green color. Furthermore, when viewed at higher viewing angles, the emission of the microcavity device will tend to shift to lower wavelengths. Therefore a high pass, or yellow, color filter can be used to suppress this shift toward blue while maintaining a high transmittance over the desired green color wavelengths.

Figure 2:
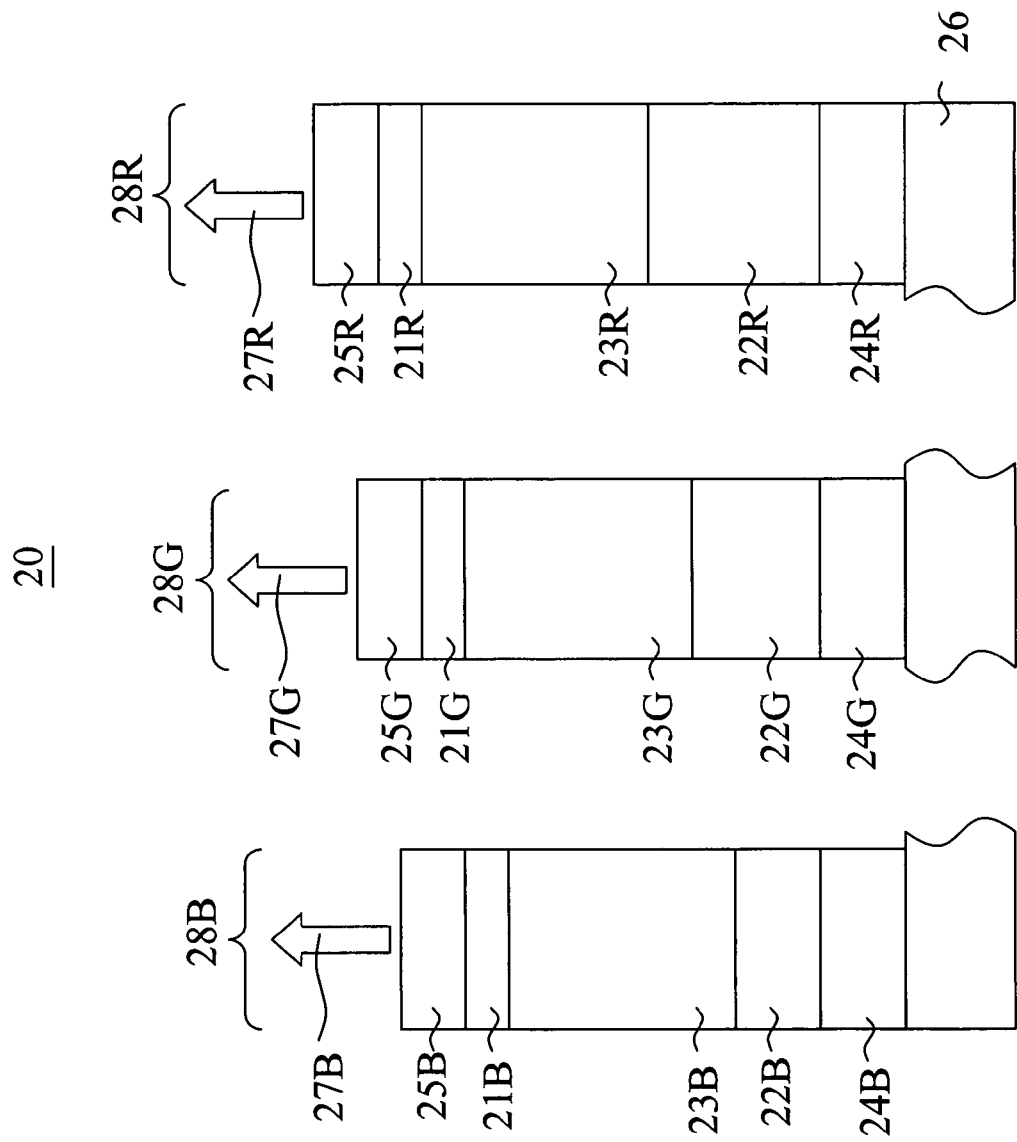
FIG. 2 depicts a cross-sectional view of a multicolor device according to the present invention.

FIG. 2 shows an alternate embodiment of the present invention. Microcavity device 20 is shown as having three emissions regions 28B, 28G, and 28R on the same substrate 26. These emission regions could, for example, represent different colored subpixels in a multicolor display. These subpixels could, for example, represent blue, green, and red subpixels in an RGB display. Microcavity device 20 is shown as a top emission device where the light generated in the organic EL medium layers does not pass through the substrate to reach a viewer.

Emission region 28G is comprised of reflector 24G, semitransparent reflector 21G, cavity spacer 22G, organic EL medium 23G, and color filter element 25G to produce filtered light emission 27G. In microcavity device 20, this emission region or subpixel is analogous to microcavity device 10 and the layers have the same purposes as described above. In this emission region the cavity length is tuned to enhance green emission and the color filter element is a high-pass or yellow type having a cut-off wavelength preferably between 475 nm and 560 nm, and more preferably between 490 nm and 540 nm.

The other emission regions can be microcavity structures (as shown) or non-microcavity structures (not shown). These emission regions could have color filter elements (as shown) that transmit at various wavelengths such as red and blue color filters. Alternately, these emission regions could be constructed without color filter elements. As shown in FIG. 2, emission region 28R corresponds to reflector 24R, semitransparent reflector 21R, cavity spacer 22R, organic EL medium 23R, and color filter element 25R to produce filtered light emission 27R. Here the cavity length is selected to enhance red emission by adjusting the thickness of the cavity spacer 22R. Emission region 28B corresponds to reflector 24B, semitransparent reflector 21B, cavity spacer 22B, organic EL medium 23B, and color filter element 25B to produce filtered light emission 27B. Here the cavity length is selected to enhance blue emission by adjusting the thickness of the cavity spacer 22B. Many of the layers, such as the organic EL mediums and the semitransparent reflectors, can be common between emission regions and would therefore not require precision patterning.

Alternately, if the device described in FIG. 2 has a red emission region which has a microcavity structure, the same high pass filter element type used in the green emission region could be applied to the red emission region. This would have an additional benefit of suppressing any blue emission which is produced by the microcavity which is tuned for red emission. Blue emission can occasionally be produced in a red emitting microcavity due to several causes. First, for example, poorly reflecting reflectors can permit some blue emission even in a red-tuned microcavity. Second, a multimode microcavity can occur when the optical cavity length is large, such as can be the case when the m value is greater than m=0 in equation 1. This occurs because blue wavelengths having a high m value, such as m=2, approximately satisfy equation 1 at the same optical cavity length as red wavelengths of a lower m value, such as m=1. Examples of multimode microcavity devices which simultaneously emit multiple colors by tuning to alternate resonate nodes are described in U.S. Pat. Nos. 5,478,658 and 5,674,636. In order to suppress any unwanted blue emission in the red emission zone, the same type of high pass or yellow filter element can be utilized in both the green emission region and red emission region.

EXAMPLE

The present invention is explained more specifically with reference to the following example.

A microcavity device (Device 1) was prepared having a configuration as follows: a transparent glass substrate; a 20 nm Ag semitransparent reflector; a 100 nm Al reflector; a plurality of organic layers with a refractive index of approximately 1.8; and no cavity spacer layer. The total thickness of the organic layers was 254 nm. This thickness was selected so as to produce a microcavity structure approximately optimized to enhance emission in the green wavelengths. A filter was not added directly to this device so that the unfiltered emission could be measured. The emission after the filter was then calculated by multiplying (cascading) the known transmission properties a color filter element to the unfiltered emission of the microcavity device.

Figure 3:
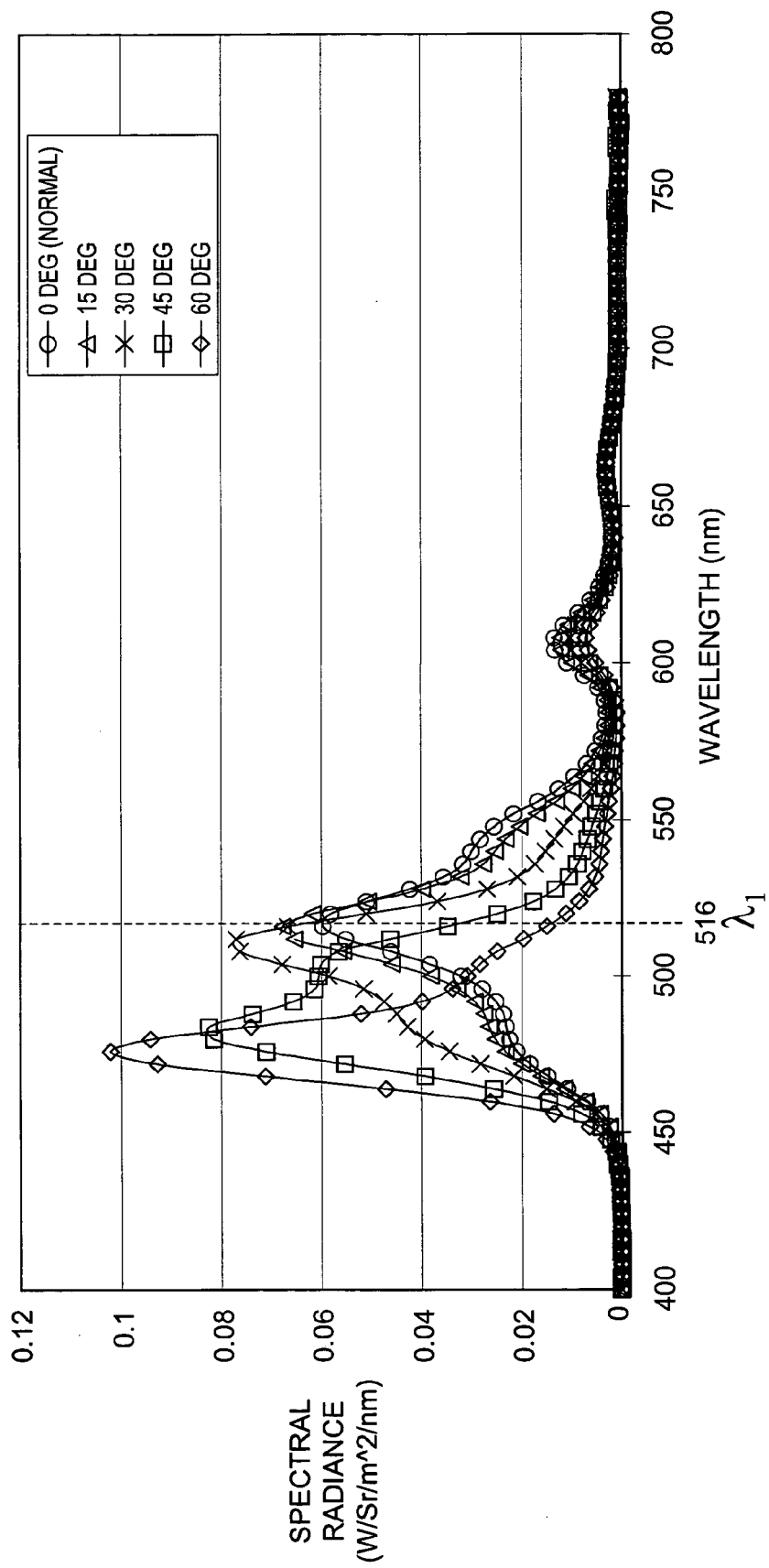
FIG. 3 depicts a chart of unfiltered spectral emission of an exemplary microcavity device.

FIG. 3 shows the emission properties of the microcavity device (Device 1) without a color filter element at viewing angles of 0 degrees (normal angle), 15 degrees, 30 degrees, 45 degrees, and 60 degrees. The emission was measured using a Photo Research® PR®-650 Spectrascan® Colorimeter. It can be seen by FIG. 3 that the microcavity device (Device 1) had emission primarily in the green wavelengths with a peak at 516 degrees. However, as the viewing angle of the device is increased to 60 degrees, the emission peak shifts to lower wavelengths and emits more blue light in the visible spectrum.

Figure 4:
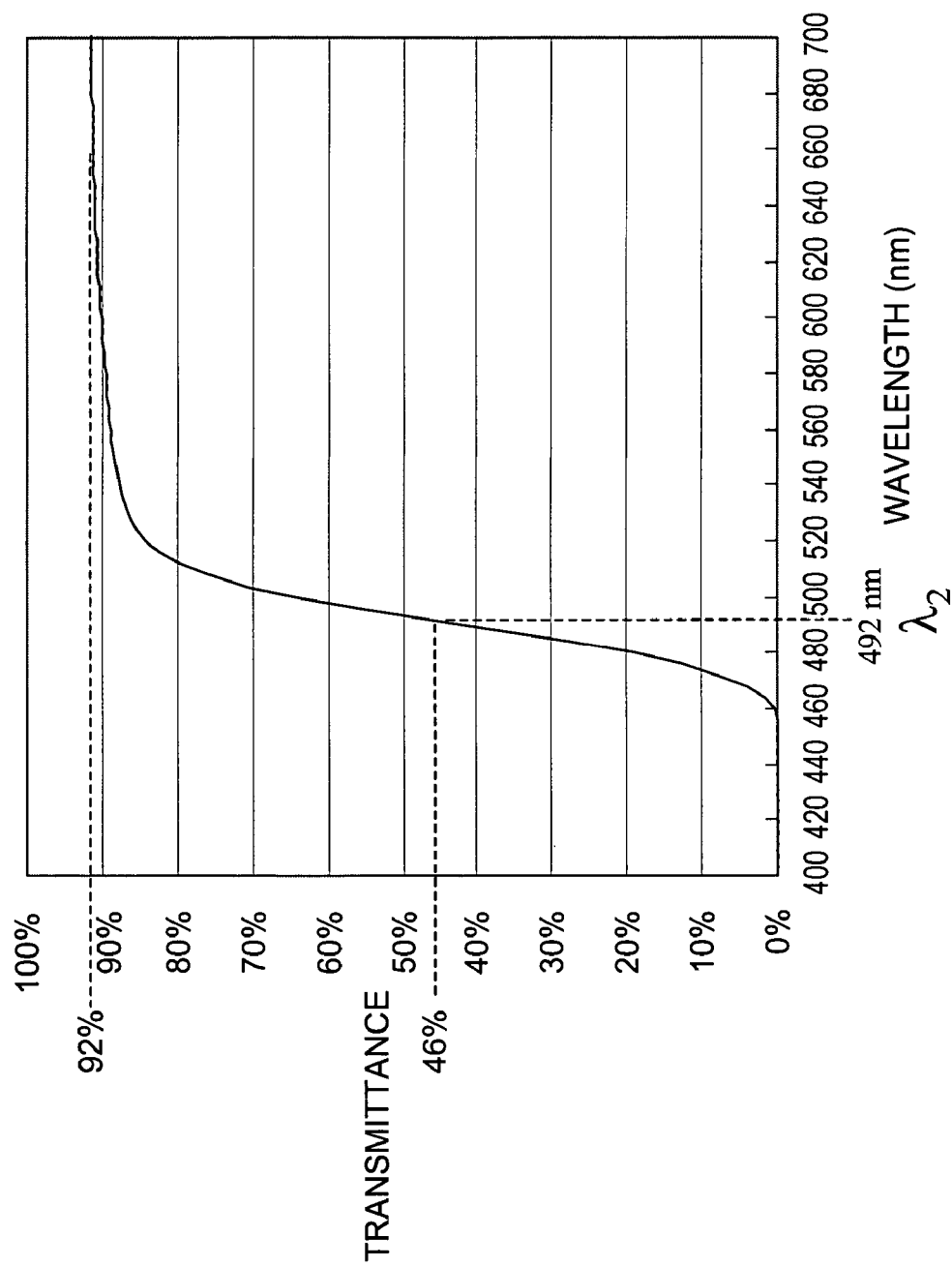
FIG. 4 depicts a chart of the transmission properties of an exemplary color filter element useful for the present invention.

FIG. 4 shows the transmittance properties of commercially available Kodak WRATTEN filter #8, a high pass color filter element useful for the present invention. This filter has a maximum visible transmittance of approximately 92% and a minimum visible transmittance of approximately 0%, and a cut-off wavelength at approximately 492 nm with a transmittance of approximately 46% at the cut-off wavelength.

Figure 5:
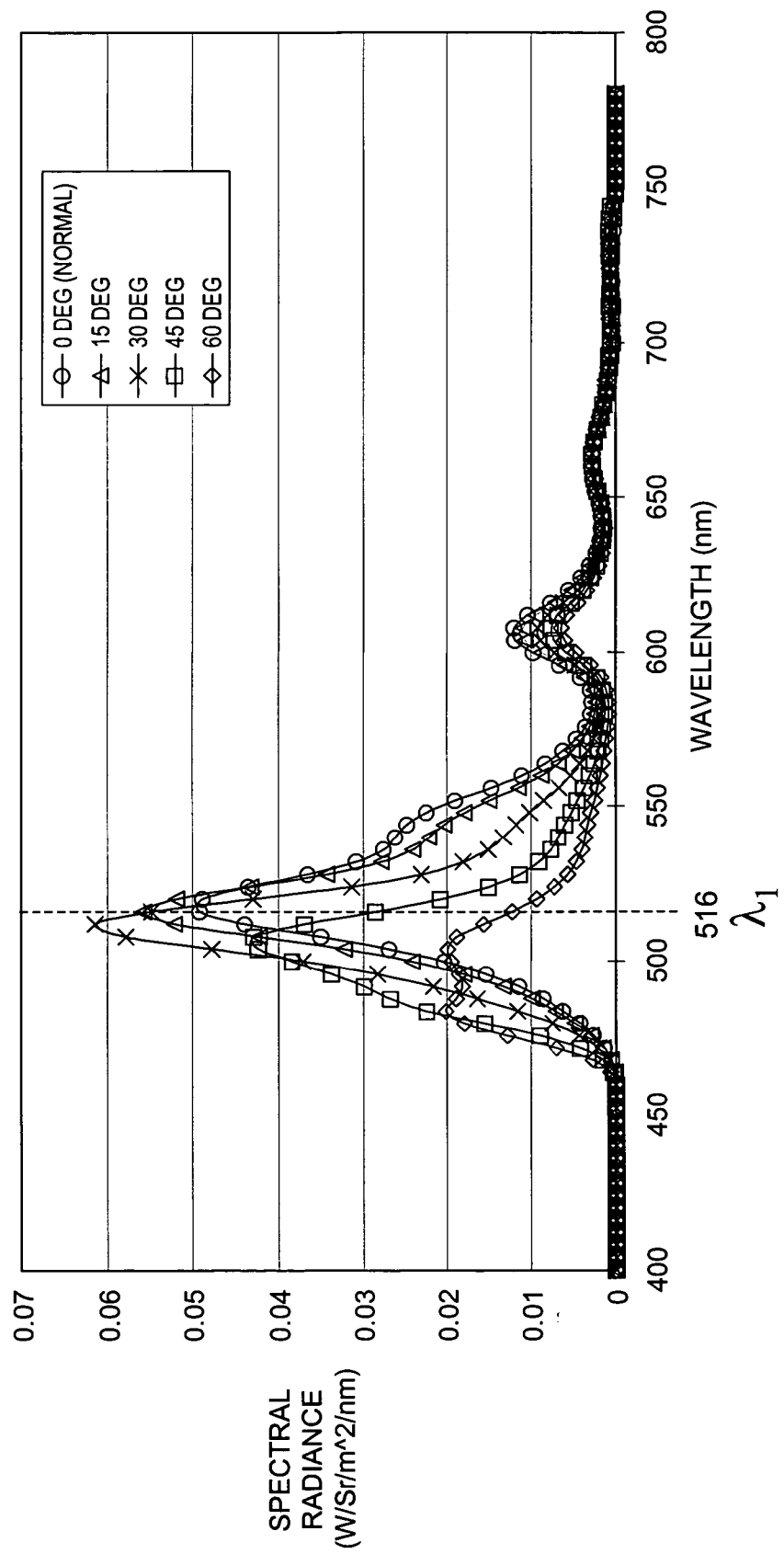
FIG. 5 depicts a chart of filtered spectral emission of an exemplary microcavity device.

FIG. 5 shows the results of cascading the 0 degree emission from the microcavity device (Device 1) as shown in FIG. 3 with the color filter element shown in FIG. 4. It can be seen from FIG. 5 that, while there is still a slight shift toward lower wavelengths as the viewing angle is increased from 0 to 60 degrees, this effect has been significantly suppressed compared to the unfiltered emission shown in FIG. 3. Therefore by applying the high pass color filter element to the microcavity device, the purity of the green color at higher viewer angles has been improved.

Figure 6:
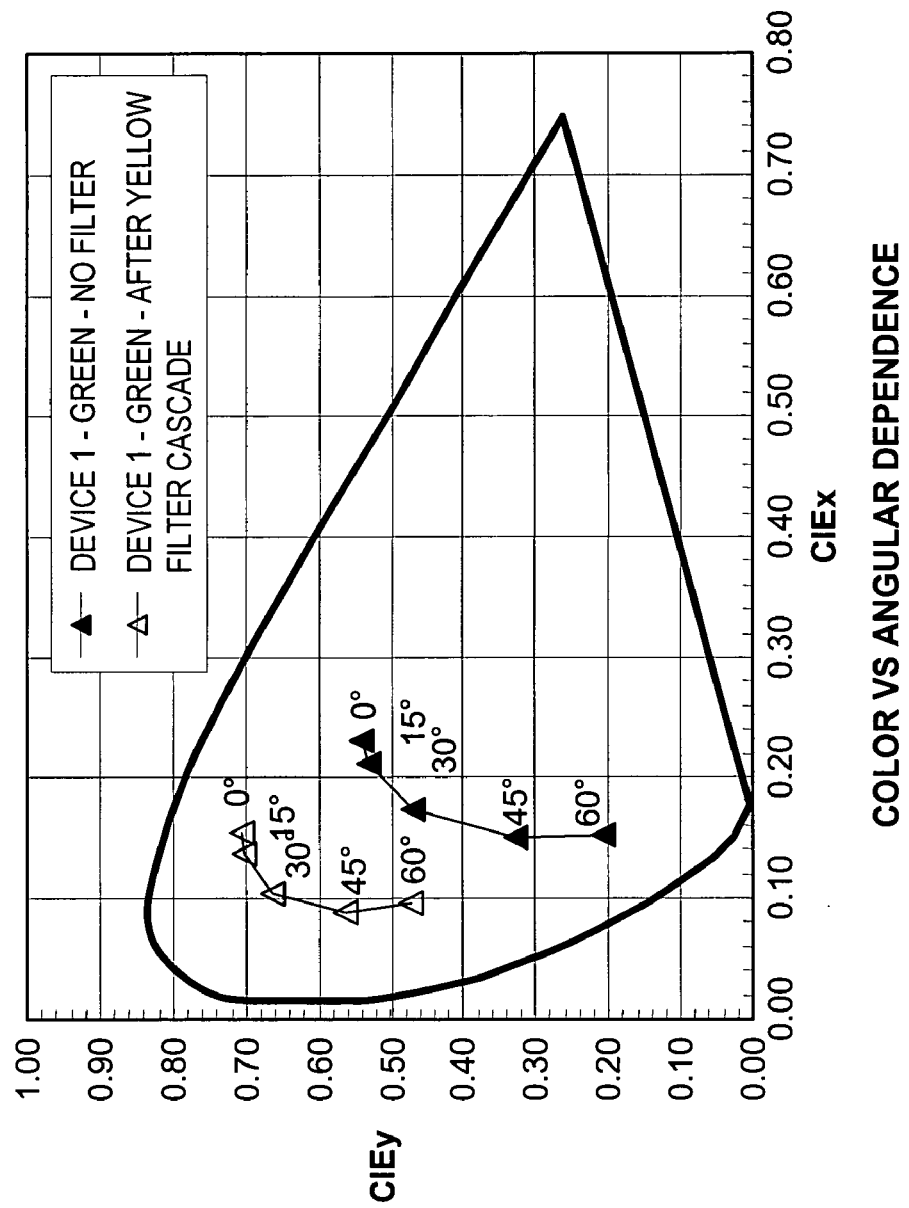
FIG. 6 depicts a chromaticity diagram for the exemplary microcavity device.

FIG. 6 shows a 1931 CIEx,y chromaticity diagram of the color stimuli for the microcavity device before and after cascading the emission with the high-pass yellow color filter element. The chromaticity coordinates are calculated based on the emissions shown in FIG. 3 (no filter) and FIG. 5 (after yellow filter cascade). It can be seen that without the filter, the green chromaticity quickly degrades to blue chromaticity position as the viewing angle approaches 60 degrees. By applying the color filter element, the initial green chromaticity is somewhat improved, and the overall shift toward blue chromaticity is suppressed with the color stimuli maintaining a more of a green chromaticity position.

The invention has been described in detail with particular reference to certain preferred embodiments thereof, but it will be understood that variations and modifications can be effected within the spirit and scope of the invention.

PARTS LIST 10 microcavity device
11 semitransparent reflector
12 cavity spacer
13 organic el medium
14 reflector
15 color filter element
16 substrate
17 filtered light emission
20 microcavity device
21B, 21G, 21R semitransparent reflector
22B, 22G, 22R cavity spacer
23B, 23G, 23R organic el medium
24B, 24G, 24R reflector
25B, 25G, 25R color filter element
26 substrate
27B, 27G, 27R filtered light emission
28B, 28G, 28R emission region

What is claimed is:

1. An organic light-emitting device (OLED) having green emitting regions disposed over a substrate, and wherein each green emitting region includes:
   a) one or more light-emitting layer(s);
   b) a reflector and a semitransparent reflector respectively disposed on opposite sides of the light-emitting layer(s) and arranged to resonate light produced by such layers such that the light has a substantial green spectral component;
   c) a yellow color filter element disposed in relationship to each green emitting region to produce green light; and
   d) wherein each yellow filter element is selected to have a cut-off wavelength between 475 nm and 560 nm and at visible wavelengths greater than the cut-off wavelength to at least 700 nm, the transmittance of the color filter element is greater than at the transmittance at the cut-off wavelength and at visible wavelengths lower than the cut-off wavelength to at least 400 nm the transmittance of the color filter element is less than at the transmittance at the cut-off wavelength.

2. The OLED device of claim 1 wherein the filter has a cut-off wavelength of between 490 nm and 540 nm.

3. The OLED device of claim 1 where the emitting region produces light having a green color and a peak light emission between 490 nm and 570 nm at a normal angle to the substrate.

4. The OLED device of claim 3 which has a peak light emission between 500 nm and 550 nm at a normal angle to the substrate.

5. The OLED device of claim 1 where the reflector, the semitransparent reflector, or both, also serve as electrodes for the light-emitting layers.

6. The OLED device of claim 5 which further comprises one or more emitting regions perceived to emit red light and one or more emitting regions perceived to emit blue light.

7. The OLED device of claim 1 where the semitransparent reflector includes Ag or an alloy containing Ag.

8. The OLED device of claim 1 which is configured to be a top emission device.

9. An organic light-emitting device (OLED) having green emitting regions and red emitting regions disposed over a substrate and wherein each green emitting region includes:
   a) one or more light-emitting layer(s);
   b) a reflector and a semitransparent reflector respectively disposed on opposite sides of the light-emitting layer(s) and arranged to resonate light produced by such layers such that the light has a substantial green spectral component, and each red emitting region includes:
      i) one or more light-emitting layer(s);
      ii) a reflector and a semitransparent reflector respectively disposed on opposite sides of the light-emitting layer(s) and arranged to resonate light produced by such layers such that the light has a substantial red spectral component; and
      iii) a yellow color filter element disposed in relationship to each green and red emitting region so as to produce green and red light respectively.

* * * * *